United States Patent
Hudgens et al.

(10) Patent No.: US 9,117,865 B2
(45) Date of Patent: Aug. 25, 2015

(54) ROBOT SYSTEMS, APPARATUS, AND METHODS HAVING INDEPENDENTLY ROTATABLE WAISTS

(71) Applicant: Applied Materials, Inc., Santa Clara, CA (US)

(72) Inventors: Jeffrey C. Hudgens, San Francisco, CA (US); Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 77 days.

(21) Appl. No.: 13/855,456

(22) Filed: Apr. 2, 2013

(65) Prior Publication Data

US 2013/0272823 A1 Oct. 17, 2013

Related U.S. Application Data

(60) Provisional application No. 61/623,128, filed on Apr. 12, 2012.

(51) Int. Cl.
*H01L 21/677* (2006.01)

(52) U.S. Cl.
CPC ......... *H01L 21/67742* (2013.01); *Y10S 901/29* (2013.01); *Y10T 74/20335* (2015.01)

(58) Field of Classification Search
CPC .................. H01L 21/67742; H01L 21/67721; H01L 21/67739; H01L 21/67766; H01L 21/67; H01L 21/683; H01L 21/67703; H01L 21/677
USPC ........................................................ 414/217
See application file for complete search history.

(56) References Cited

U.S. PATENT DOCUMENTS

| | | | |
|---|---|---|---|
| 5,046,992 A | | 9/1991 | Tamai et al. |
| 5,151,008 A | * | 9/1992 | Ishida et al. ............... 414/744.5 |
| 5,447,409 A | | 9/1995 | Grunes et al. |
| 5,789,878 A | | 8/1998 | Kroeker et al. |
| 5,838,121 A | | 11/1998 | Fairbairn et al. |
| 6,102,649 A | | 8/2000 | Ogawa et al. |
| 6,105,454 A | * | 8/2000 | Bacchi et al. .............. 74/490.03 |
| 6,155,768 A | * | 12/2000 | Bacchi et al. ............ 414/416.03 |

(Continued)

FOREIGN PATENT DOCUMENTS

| | | |
|---|---|---|
| WO | WO 2010/080983 | 7/2010 |
| WO | WO 2010/081003 | 7/2010 |

OTHER PUBLICATIONS

Kremerman et al., U.S. Appl. No. 13/662,946 (16628), filed Oct. 29, 2012.

(Continued)

*Primary Examiner* — Kaitlin Joerger
(74) *Attorney, Agent, or Firm* — Dugan & Dugan, PC

(57) ABSTRACT

Electronic device processing systems and robot apparatus are described. The systems and apparatus are adapted to efficiently pick or place substrates into twin chambers by having independently rotatable first and second booms, and independently rotatable first and second upper arms, wherein each upper arm has a forearm, a wrist member, and an end effector adapted to carry a substrate coupled thereto. The boom members and upper arms are driven through co-axial drive shafts in some embodiments. Co-axial and non-coaxial drive motors are disclosed. Methods of operating the robot apparatus and processing systems are provided, as are numerous other aspects.

20 Claims, 9 Drawing Sheets

(56) References Cited

U.S. PATENT DOCUMENTS

| | | |
|---|---|---|
| 6,267,549 B1 | 7/2001 | Brown et al. |
| 6,485,250 B2 * | 11/2002 | Hofmeister ............... 414/744.1 |
| 6,499,936 B2 * | 12/2002 | Ishigame ................... 414/744.5 |
| 6,655,901 B2 * | 12/2003 | Tsubota et al. ............ 414/744.5 |
| 6,699,003 B2 * | 3/2004 | Saeki et al. ............... 414/744.5 |
| 6,737,826 B2 | 5/2004 | Gilchrist |
| 6,742,977 B1 * | 6/2004 | Okayama et al. ............ 414/217 |
| 6,764,271 B2 | 7/2004 | Momoki |
| 7,578,649 B2 * | 8/2009 | Caveney et al. ........... 414/744.5 |
| 7,688,017 B2 | 3/2010 | Hudgens |
| 7,891,935 B2 * | 2/2011 | Kremerman .............. 414/744.5 |
| 7,927,062 B2 | 4/2011 | Rice et al. |
| 7,933,002 B2 | 4/2011 | Halldorsson |
| 7,933,009 B2 | 4/2011 | Serebryanov et al. |
| 7,946,800 B2 | 5/2011 | Hosek et al. |
| 8,007,218 B2 | 8/2011 | Park et al. |
| 8,016,542 B2 * | 9/2011 | Cox et al. .................. 414/744.5 |
| 8,061,232 B2 | 11/2011 | Kroetz et al. |
| 8,264,187 B2 | 9/2012 | Laceky et al. |
| 8,376,685 B2 * | 2/2013 | Pietrantonio et al. ...... 414/744.5 |
| 8,651,796 B2 * | 2/2014 | Hosek et al. .............. 414/744.5 |
| 8,784,033 B2 * | 7/2014 | Kremerman et al. ...... 414/744.5 |
| 2002/0114690 A1 * | 8/2002 | Ishigame ................... 414/744.5 |
| 2005/0118010 A1 * | 6/2005 | Ogawa et al. .............. 414/744.1 |
| 2005/0217053 A1 * | 10/2005 | Kim et al. ................. 15/250.21 |
| 2006/0099063 A1 * | 5/2006 | Pietrantonio et al. ...... 414/744.5 |
| 2006/0210387 A1 * | 9/2006 | Saeki et al. ............... 414/744.5 |
| 2010/0178146 A1 | 7/2010 | Kremerman et al. |
| 2010/0178147 A1 | 7/2010 | Kremerman et al. |
| 2011/0135437 A1 * | 6/2011 | Takeshita et al. .......... 414/744.5 |
| 2011/0224822 A1 * | 9/2011 | Hosek et al. ................. 700/245 |
| 2011/0262251 A1 * | 10/2011 | Otogawa et al. .......... 414/222.02 |
| 2012/0189419 A1 * | 7/2012 | Yazawa et al. ............ 414/744.2 |
| 2013/0039726 A1 * | 2/2013 | Brodine et al. ........... 414/226.05 |
| 2013/0115028 A1 * | 5/2013 | Kremerman et al. ......... 414/217 |
| 2013/0164101 A1 * | 6/2013 | Noguchi et al. ............. 414/217 |
| 2013/0183121 A1 * | 7/2013 | Isomura et al. .............. 414/217 |
| 2013/0183122 A1 * | 7/2013 | Mizokawa et al. ......... 414/217.1 |
| 2013/0183131 A1 * | 7/2013 | Blank et al. ................ 414/744.5 |
| 2013/0287529 A1 * | 10/2013 | Yang et al. ............... 414/222.09 |
| 2014/0170862 A1 * | 6/2014 | Toyoda ......................... 438/795 |

OTHER PUBLICATIONS

Cox et al., U.S. Appl. No. 13/709,485 (16851), filed Dec. 10, 2012.

International Search Report and Written Opinion of International Application No. PCT/US13/34902 (17054/PCT) mailed Jul. 11, 2013.

International Preliminary Report on Patentability of International Application No. PCT/US13/34902 (17054/PCT) mailed Oct. 23, 2014.

* cited by examiner

ROBOT SYSTEMS, APPARATUS, AND METHODS HAVING INDEPENDENTLY ROTATABLE WAISTS

RELATED APPLICATIONS

The present application claims priority from U.S. Provisional Patent Application Ser. No. 61/623,128, filed Apr. 12, 2012, entitled "ROBOT SYSTEMS, APPARATUS, AND METHODS HAVING INDEPENDENTLY ROTATABLE WAISTS" which is hereby incorporated herein by reference in its entirety for all purposes.

FIELD

The present invention relates to electronic device manufacturing, and more specifically to systems, apparatus, and methods adapted to transport substrates.

BACKGROUND

Conventional electronic device manufacturing systems may include process tools having multiple chambers, such as process chambers and one or more load lock chambers. Such process chambers may be used to carry out any number of processes on the substrates, such as deposition, oxidation, nitration, etching, polishing, cleaning, lithography, metrology, or the like. Substrates as referred to herein are silica wafers, silica plates, glass panels, and the like. Within the process tool, a plurality of such chambers may be distributed about a centrally-located transfer chamber, for example. A transfer robot may be housed within the transfer chamber and configured and adapted to transport substrates between the various chambers. For example, transfers may be between process chambers or between process chambers and load lock chambers. Conventional slit valves may be located at the entries into each respective chamber. Efficient and precise transport of substrates between these chambers is sought to improve system throughput.

Accordingly, improved systems, apparatus, and methods for efficient and precise movement of substrates are desired.

SUMMARY

In a first aspect a robot apparatus is provided. The robot apparatus may be adapted to transport substrates within an electronic device processing system. The robot apparatus includes a first boom adapted to rotate about a first rotational axis, a first upper arm coupled to the first boom at a position offset from the first rotational axis, the first upper arm rotatable about a second rotational axis, a first forearm coupled to and adapted for rotation relative to the first upper arm about a third rotational axis at a position offset from the second rotational axis, a first wrist member coupled to and adapted for rotation relative to the first forearm about a fourth rotational axis at a position offset from the third rotational axis, the first wrist member adapted to couple to a first end effector, and a second boom adapted to rotate about the fifth rotational axis independent of the first boom, a second upper arm coupled to the second boom at a position offset from the fifth rotational axis, the second upper arm rotatable about a sixth rotational axis, a second forearm coupled to and adapted for rotation relative to the second upper arm about a seventh rotational axis at a position offset from the sixth rotational axis, and a second wrist member coupled to and adapted for rotation relative to the second forearm about an eight rotational axis at a position offset from the seventh rotational axis, the second wrist member adapted to couple to a second end effector.

According to another aspect an electronic device processing system is provided. The electronic device processing system includes a chamber, a robot apparatus at least partially contained in the chamber and adapted to transport substrates to and from process chambers, the robot apparatus including a first boom adapted to rotate about a first rotational axis, a first upper arm coupled to the first boom at a position offset from the first rotational axis, the first upper arm rotatable about a second rotational axis, a first forearm coupled to and adapted for rotation relative to the first upper arm about a third rotational axis at a position offset from the second rotational axis, a first wrist member coupled to and adapted for rotation relative to the first forearm about a fourth rotational axis at a position offset from the third rotational axis, the first wrist member adapted to couple to a first end effector, and a second boom adapted to rotate about the fifth rotational axis independent of the first boom, a second upper arm coupled to the second boom at a position offset from the fifth rotational axis, the second upper arm rotatable about a sixth rotational axis, a second forearm coupled to and adapted for rotation relative to the second upper arm about a seventh rotational axis at a position offset from the sixth rotational axis, and a second wrist member coupled to and adapted for rotation relative to the second forearm about an eight rotational axis at a position offset from the seventh rotational axis, the second wrist member adapted to couple to a second end effector.

In another aspect, a method of transporting substrates within an electronic device processing system is provided. The method of transporting substrates includes providing a robot apparatus having a first boom with a first upper arm rotatably coupled to the first boom, a first forearm rotatably coupled to the first upper arm, and a first wrist member rotatably coupled to the first forearm, and a second boom with a second upper arm rotatably coupled to the second boom, a second forearm rotatably coupled to the second upper arm, and a second wrist member rotatably coupled to the second forearm, the first boom and second boom being rotatable about a first rotational axis, and independently rotating the first boom relative to the second boom about the first rotational axis.

Numerous other features are provided in accordance with these and other aspects and embodiments of the invention. Other features and aspects of embodiments of the present invention will become more fully apparent from the following detailed description, the appended claims, and the accompanying drawings.

DETAILED DESCRIPTION

As discussed above, in electronic device manufacturing processing it is desirable to provide precise and rapid transport of substrates between various locations (e.g., between chambers). Although existing robots provide an acceptable level of throughput, it is a goal to lower overall operating and production costs. Furthermore, reduced system size is sought after, so that the distances the substrates are moved can be reduced. Moreover, material and manufacturing costs may be reduced by reducing system size. Additionally, it is desirable to place the substrates within the chambers with a desired level of precision. However, sometimes a substrate may become misaligned on an end effector in transit. In particular, the substrate may slip and become displaced on an end effector on which the substrate is transported. Accordingly, this may translate into substrate misalignment within a process chamber. Misalignment within a process chamber may result in processing anomalies, and is therefore undesirable.

Heretofore, twin robots, i.e., those being adapted to transfer substrates into and out of twin chambers, have not been able to account for at least lateral misalignment of one or more of the substrates on the end effectors. Twin chambers are used herein means two chambers that are arranged in a side-by side orientation wherein substrates are processed into and out of the twin chambers in substantial unison. Such twin chambers may have facets of the adjacent chambers that are substantially parallel. Typical substrate processing systems may have two or more, four or more, six or more, or even eight facets.

In particular, according to embodiments of the present invention, an end effector, sometimes referred to as a "blade," may be attached to each wrist member of the robot apparatus and may be adapted to transport a substrates resting upon each end effector to and from adjacent twin process chambers and/or to and from adjacent load lock chambers of an electronic device processing system. "Load lock" as used herein is a chamber used to transfer substrates to and from a transfer chamber.

Figure 1A:
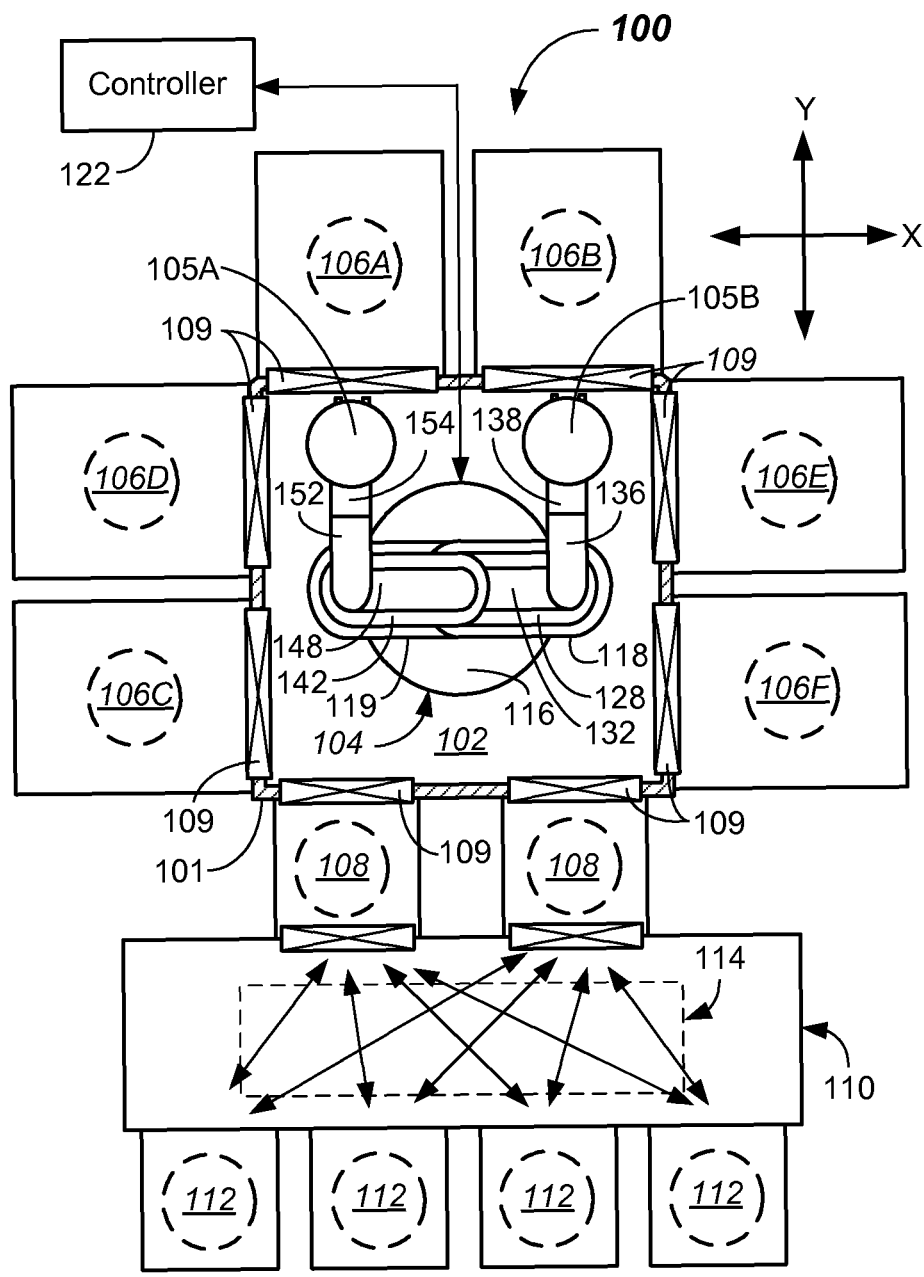
FIG. 1A illustrates a schematic top view of an electronic device processing system including a robot apparatus provided in a transfer chamber according to embodiments.

Conventional systems including selective compliance arm robot apparatus (SCARA) robots may only enter and exit transfer chambers in a generally straight-on fashion, thereby limiting their versatility and adjustability. Furthermore, in some systems, especially mainframes having a large number of twin chambers (e.g., 1 or more twin facets, 2 or more twin facets, or even 3 twin facets) and multiple load lock chambers, such as shown in FIG. 1A, not only is it desirable to make the transfer chamber as small as possible in order to reduce system cost and size, but it is also desirable to precisely place substrates in each of the respective twin chambers as discussed above. In particular, in electronic device processing systems having twin chambers, where transfers into and out of twin chambers may be made substantially simultaneously, sometimes one or more of the substrates may become misplaced (e.g., un-centered) on one or more of the end effectors. This results in misalignment of the one or more substrates within the respective process chamber. Accordingly, it is desired to be able to adjust for substrate misalignment within one or both of the twin process chambers. Moreover, packaging of the robot apparatus in a small space envelope represents a significant challenge for existing robots, while still being able to carry out substrate exchange at twin chambers. Additionally, it is desirable to eliminate motor wires within the vacuum areas, as well as expensive moving seals (e.g., ferro-fluid seals) from the robot apparatus.

In order to accomplish one or more of the above, one or more embodiments, in a first aspect, are directed at an improved robot apparatus adapted to service twin process chambers. The robot apparatus includes independently-rotatable, first and second booms that are each rotatable about a common waist axis (e.g., a first rotational axis). Each of the first and second booms includes an upper arm coupled to an outboard portion thereof, a forearm coupled to each respective upper arm, and a wrist member coupled to each respective forearm. An end effector adapted to support a substrate may be coupled to the respective wrist members.

According to some embodiments, rotation of the independently-rotatable first and second booms, as well as rotation of the first and second upper arms coupled to the booms may be provided by including drive shafts that are co-axial and driven from a remote position outside of the transfer chamber. Moreover, the respective drive motors that are adapted to cause rotation of the first and second booms and the attached upper arms, forearms, and wrist members may be provided in a common area (e.g., within a drive assembly). The drive motors may be coaxial or distributed within the drive assembly. These highly-functional configurations enable the overall size envelope of the robot and transfer chamber to be reduced, and may allow entry into process chambers and load lock chambers in a non straight-on orientation, i.e., non-normal to a chamber facet. Furthermore, in one or more embodiments, the use of expensive seals may be reduced. According to embodiments, in one advantage, an orientation of one or more of the end effectors may be changed/adjusted in a lateral sense (across the process chamber) or a longitudinal sense (along an entry direction into the chamber) when both end effectors are extended into the twin chambers, such that misalignment for one or both of the substrates within the twin chambers may be corrected. Thus, in one aspect, a twin robot apparatus adapted to service twin chambers that has longitudinal and/or lateral misalignment correction capability for one or both of the supported substrates is provided.

In other aspect, an electronic device processing system including the robot apparatus is provided, as are methods of operating the robot apparatus and electronic device processing system. The robot apparatus and methods are useful for transporting substrates to and from twin chambers, such as between one set of twin chambers and another set of twin chambers and/or load locks in electronic device manufacturing.

Further details of various aspects of the robot apparatus, electronic device processing systems, and methods according to example embodiments are described with reference to FIGS. 1A-4 herein.

Referring now to FIGS. 1A-1E, an example embodiment of an electronic device processing system 100 according to embodiments is disclosed. The electronic device processing system 100 is useful, and may be configured and adapted to transfer substrates to and from various chambers, such as into and out of twin process chambers, and/or into and out of twin load lock chambers, and/or between various twin process chambers, and/or transfer substrates to and from adjacent load lock chambers, for example. Other transfer combinations may be performed by the apparatus.

The electronic device processing system 100 may include one or more sets of twin chambers such as twin chamber sets 106A and 106B, sets 106C and 106D, and sets 106E and 106F. The electronic device processing system 100 includes a housing 101 including a transfer chamber 102. The transfer chamber 102 may include top, bottom, and side walls, and, in some embodiments, may be maintained at a vacuum, for example. A robot apparatus 104 having multiple arms is at least partially received in the transfer chamber 102 and is adapted to be operable therein to transfer substrates. The robot apparatus 104 may be adapted to pick or place substrates 105A, 105B (sometimes referred to as a "wafers" or "semiconductor wafers" or "glass substrates") to or from destination locations. However, any type of substrate may be conveyed and transferred by the robot apparatus 104.

Figure 1B:
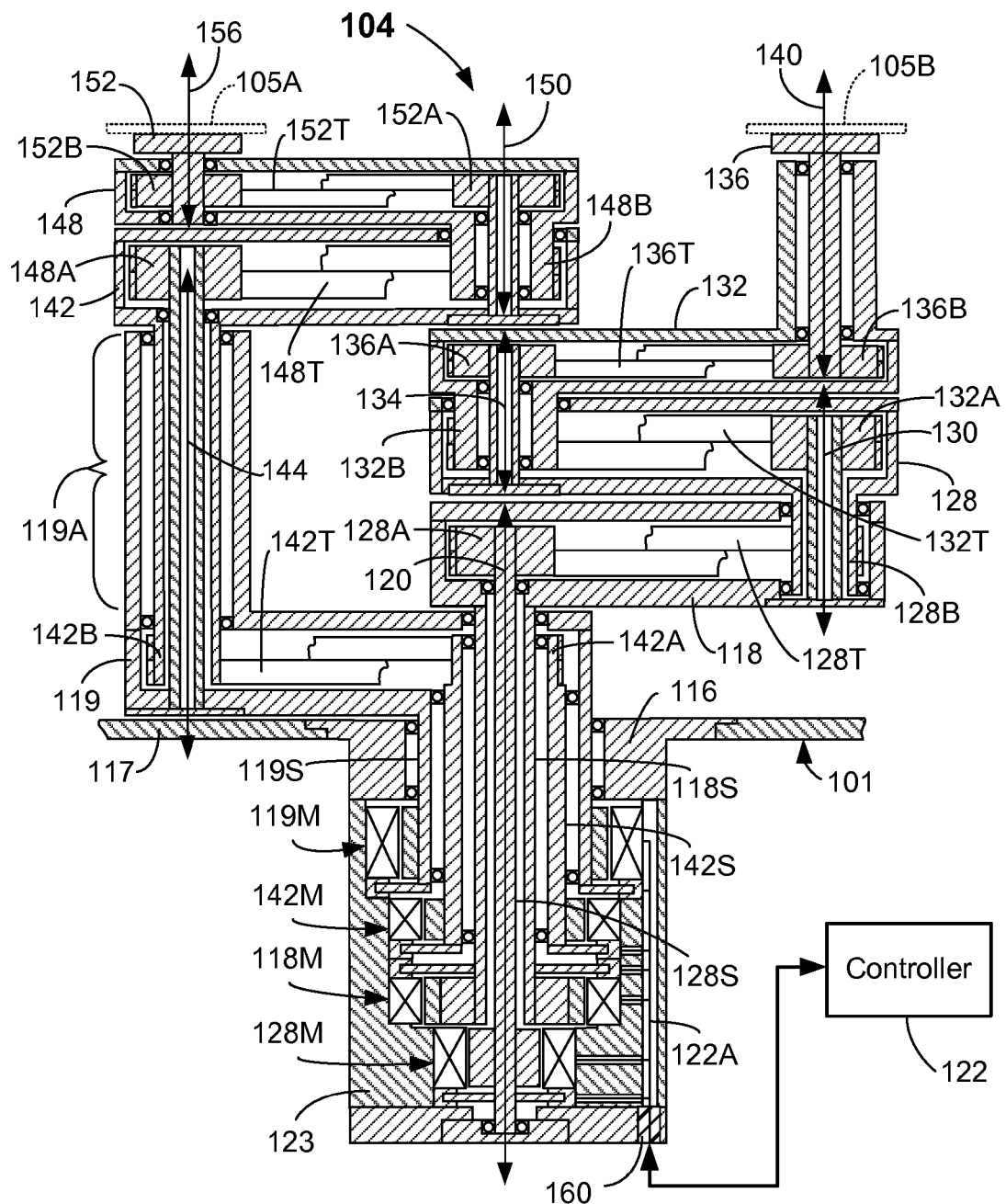
FIG. 1B illustrates a cross-sectional side view of a robot apparatus according to embodiments, shown in a folded orientation.

The destination locations may be any of the twin chambers coupled to the transfer chamber 102. For example, the destination may be one or more of twin process chamber sets 106A and 106B, sets 106C and 106D, and sets 106E and 106F and/or one or more load lock chambers 108 that may be disbursed about and coupled to the transfer chamber 102. As shown, transfer to and from each twin chamber set 106A and 106B, set 106C and 106D, and set 106E and 106F, and load lock chamber 108 may be through slit valves 109, for example. The slit valve 109 is of conventional construction and will not be described further herein. FIG. 1B illustrate a cross-sectioned side view of the robot apparatus 104. The FIG. 1B view is shown in a folded condition, being ready to insert substrates into a twin chamber set (e.g., 106A and 106B).

Referring again to FIG. 1A, process chambers 106A-106F may be adapted to carry out any number of processes on the substrates 105A, 105B and other substrates, such as deposition, oxidation, nitration, etching, polishing, cleaning, lithography, metrology, or the like. Other processes may be carried out. The load lock chambers 108 may be adapted to interface with a factory interface 110 or other system component that may receive substrates (e.g., substrates 105A, 105B) from one or more substrate carriers 112 (e.g., Front Opening Unified Pods (FOUPs)) docked at one or more load ports of the factory interface 110. Another suitable robot (shown as a dotted box) may be used to transfer various substrates between the substrate carriers 112 and the load locks 108 as indicated by arrows 114. Transfers of substrates may be carried out in any sequence or direction as indicated by arrows 114.

Again referring to FIGS. 1A-1E, the robot apparatus 104 may include a base 116 that may include a flange or other attachment features adapted to be attached and secured to a wall 117 (e.g., a floor) of the housing 101 forming a part of the transfer chamber 102. The robot apparatus 104 includes a first boom 118 and a second boom 119, which, in the depicted embodiment, are each substantially rigid cantilever beams. The first boom 118 is adapted to be independently rotated about a first rotational axis 120 relative to the base 116 and/or wall 117 in both of a clockwise or counterclockwise rotational direction. Likewise, the second boom 119 is adapted to be independently rotated about the first rotational axis 120 relative to the base 116 and/or wall 117 in both of a clockwise or counterclockwise rotational direction. Rotation of the first and second booms 118, 119 may be +/−360 degrees or more. In the depicted embodiment, the first rotational axis 120 is stationary. This embodiment of robot apparatus 104 does not include Z axis capability and should be used with lift pins, moving platforms, or the like in the various process chambers 106A-106F and load lock chambers 108.

The rotation of the first boom 118 in an X-Y plane about first rotational axis 120 may be provided by any suitable motive member, such as by an action of a first boom drive motor 118M rotating an boom drive shaft 118S of a first boom drive assembly. The first boom drive motor 118M may be a conventional variable reluctance or permanent magnet electric motor. Other types of motors may be used. The rotation of the first boom 118 may be controlled by suitable commands provided to the first boom drive motor 118M from a controller 122. Controller 122 may provide positional commands to each of the respective drive motors and may receive positional feedback information from a suitable positional encoder or sensor via a wiring harness 122A. The first boom drive motor 118M may be contained in a motor housing 123 coupled to the base 116, for example. Any suitable type of feedback device may be provided to determine a precise rotational position of the first boom 118. For example, a rotary encoder may be coupled between the motor housing 123 and the first boom drive shaft 118S. The rotary encoder may be magnetic, optical, or the like. In some embodiments, the motor housing 123 and base 116 may be made integral with one another. In other embodiments, the base 116 may be made integral with the wall 117 of the transfer chamber 102.

Likewise, the rotation of the second boom 119 in the X-Y plane about first rotational axis 120 may be provided by any suitable motive member, such as by an action of a second boom drive motor 119M rotating a second boom drive shaft 119S of a second boom drive assembly. The second boom drive motor 119M may be a conventional variable reluctance or permanent magnet electric motor. Other types of motors may be used. The rotation of the second boom 119 may be controlled by suitable commands provided to the second boom drive motor 119M from the controller 122. Controller 122 may also receive positional feedback information from a suitable positional encoder or sensor via the wiring harness 122A.

Mounted and rotationally coupled at a first position spaced from the first rotational axis 120 (e.g., at an outboard end of the first boom 118), is a first upper arm 128. The first upper arm 128 is adapted to be rotated in an X-Y plane relative to the first boom 118 about a second rotational axis 130 located at the first position. The first upper arm 128 is independently rotatable in the X-Y plane relative to the first beam 118 by a first upper arm drive assembly.

Rotation of the first upper arm 128 in the X-Y plane about second rotational axis 130 may be provided by any suitable motive member, such as by an action of a first upper arm drive motor 128M rotating a first upper arm drive shaft 128S. The first upper arm drive motor 128M may be a conventional variable reluctance or permanent magnet electric motor. Other types of motors may be used. The rotation of the first upper arm 128 may be controlled by suitable commands provided to the first upper arm drive motor 128M from the controller 122. Controller 122 may also receive positional feedback information from a suitable positional encoder or sensor coupled to the first upper arm drive shaft 128S via the wiring harness 122A.

The first upper arm drive assembly may comprise any suitable structure for driving the first upper arm 128. The first upper arm drive assembly may include, for example, a rotor of the first upper arm drive motor 128M coupled to the first upper arm drive shaft 128S. The first upper arm drive assembly may further include a first upper arm driving member 128A, a first upper arm driven member 128B, and a first upper arm transmission element 128T. The first upper arm driving member 128A may be coupled to the first upper arm drive shaft 128S, whereas the first upper arm driven member 128B may be a pilot extending from a body of the first upper arm 128. For example, in the depicted embodiment, the first upper arm driving member 128A may be a pulley coupled to or integral with the first upper arm drive shaft 128S. The first upper arm transmission element 128T is connected between the first upper arm driving member 128A and first upper arm driven member 128B. The first upper arm transmission element 128T may be one or more belts or straps, such as two oppositely-wound conventional metal straps wherein each strap is rigidly coupled (e.g., pinned) to the members 128A, 128B at its end.

Mounted and rotationally coupled at a position spaced from the second rotational axis 130 (e.g., at an outboard end of the first upper arm 128), is a first forearm 132. The first forearm 132 is adapted to be rotated in an X-Y plane relative to the first upper arm 128 about a third rotational axis 134 located at the spaced position. The first forearm 132 is rotatable in the X-Y plane relative to the first upper arm 118 by the first upper arm drive assembly.

In particular, the first forearm 132 is adapted to be rotated in either a clockwise or counterclockwise rotational direction about the third rotational axis 134. Rotation may be +/−about 140 degrees. The rotation of the first forearm 132 about the third rotational axis 134 may be provided by an action of a forearm drive assembly. The forearm drive assembly includes a first forearm driving member 132A and a first forearm driven member 132B connected by a first forearm transmission element 132T. The first forearm driving member 132A may be a pulley rigidly coupled to the first beam 118, such as at its lower end by a shaft. Other types of rigid connections may be used. The first forearm driven member 132B may be a pilot extending from a body of the first forearm 132, such as at a lower end thereof. The first forearm transmission element 132T may be one or more belts. In some embodiments, the one or more belts may be first and second steel belts wrapped about the first forearm driving member 132A and the first forearm driven member 132B in opposite directions wherein each belt is discontinuous and pinned at its respective ends to each of the members 132A, 132B.

Figure 1C:
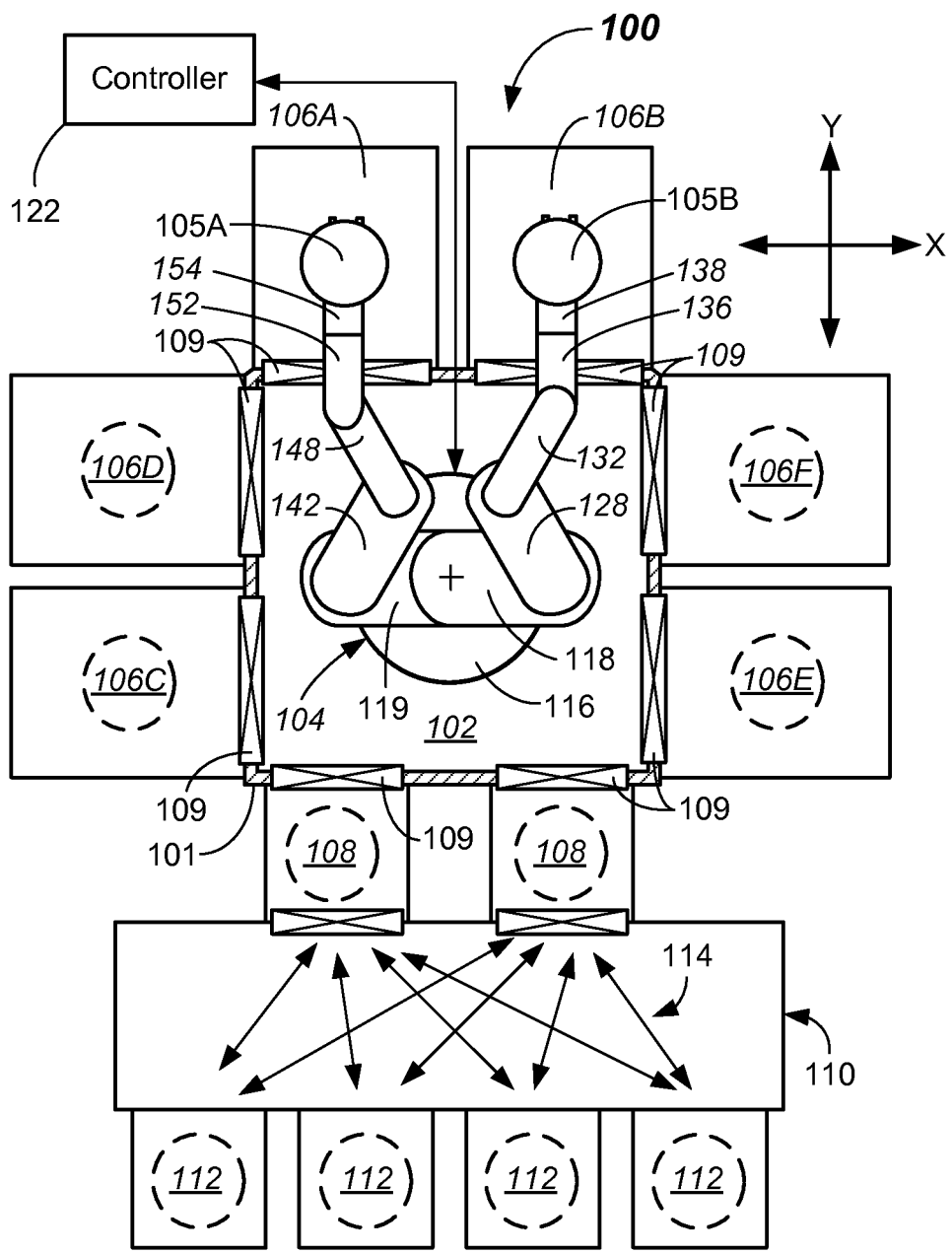
FIG. 1C illustrates a schematic top view of an electronic device processing system including a robot apparatus having end effectors supporting substrates simultaneously inserted into twin chambers according to embodiments.

Located at a position spaced (e.g., offset) from the third rotational axis 134 (e.g., on an outboard end of the first forearm 132) is a first wrist member 136. The first wrist member 136 is adapted for translation in the X-Y plane relative to the base 116 and is coupled to the first end effector 138. The first wrist member 136 is also adapted for relative rotation about a fourth rotational axis 140 relative to the first forearm 132. As is shown in FIGS. 1F and 1G, the first wrist member 136 may couple to the first end effector 138 (otherwise referred to as a "blade"), at a point outboard from the fourth rotational axis 140 wherein the first end effector 138 is adapted to carry and transport a substrate 105B (shown dotted) during pick and/or place operations.

Rotation of first wrist member 136, and thus the first end effector 138, is imparted by a first wrist member drive assembly. The first wrist member 136 is adapted for rotation relative to the first forearm 132 in either a clockwise or counterclockwise rotational direction about the fourth rotational axis 140 by the first wrist member drive assembly. Rotation may be +/−about 140 degrees. In particular, relative rotation between the first forearm 132 and the first wrist member 136 causes the first wrist member 136 and coupled first end effector 136 and supported substrate 105B to translate in the Y direction into the process chamber 106B as shown in FIG. 1C. Translations in other directions are possible by rotating for the first boom 118 and activation of the first upper arm drive assembly.

In the depicted embodiment, the first wrist member drive assembly includes, as best shown in FIG. 1B, a first wrist member driving member 136A and a first wrist member driven member 136B connected by a first wrist member transmission element 136T. The first wrist member driving member 136A may be a pulley rigidly coupled to the first upper arm 128, such as at its lower end by a shaft. Other types of rigid connections may be used. The first wrist member driven member 136B may be a pulley coupled to a pilot extending from a body of the first wrist member 136. The first wrist member transmission element 136T may be one or more belts. In some embodiments, the one or more belts may be first and second steel belts, as described above, oppositely wrapped about the first wrist member driving member 136A and the first wrist member driven member 136B.

As is shown in FIG. 1B, the first boom 118, first upper arm 128, and first forearm 132, are all received between the second boom 119 and the second upper arm 142 in the folded configuration, as shown in FIGS. 1A and 1B. Additionally, the first rotational axis and the third rotational axis 134 may be co-axial in the folded configuration. In the depicted embodiment, the first boom 118, first upper arm 128, and first forearm 132 are all of equal lengths, measured center-to center. However, it should be recognized that the center-to-center length of the first boom 118 from the first rotational axis 120 to the second rotational axis 130 may be different than a center-to-center lengths of the first upper arm 128 and first forearm 132, i.e., the lengths between the second rotational axis 130 and the third rotational axis 134, and the length between the third rotational axis 134 and the fourth rotational axis 140.

For example, the center-to-center length of the first boom 118 may be longer than the center-to-center length of the first upper arm 128 in order to fully compensate for any misalignment on the substrate 105B in the process chamber 106B. For example, the center-to-center length of the first boom 118 may be 10% or more longer than the center-to-center length of the first upper arm 128.

Again referring to FIGS. 1A and 1B, mounted and rotationally coupled at a first position spaced from the first rotational axis 120 (e.g., at an outboard end of the second boom 119), is a second upper arm 128. The second upper arm 142 may have a same center-to-center dimension as the first upper arm 128. The second upper arm 142 is adapted to be rotated in an X-Y plane relative to the second boom 119 about a fifth rotational axis 144 located at the first position. The second upper arm 144 is independently rotatable in the X-Y plane relative to the second beam 119 by a second upper arm drive assembly.

Rotation of the second upper arm 142 in the X-Y plane about fifth rotational axis 144 may be provided by any suitable motive member, such as by an action of a second upper arm drive motor 142M rotating a second upper arm drive shaft 142S. The second upper arm drive motor 142M may be a conventional variable reluctance or permanent magnet electric motor. Other types of motors may be used. The rotation of the second upper arm 142 may be controlled by suitable commands provided to the second upper arm drive motor 142M from the controller 122. Controller 122 may also receive positional feedback information from a suitable positional encoder or sensor coupled to the second upper arm drive shaft 142S via the wiring harness 122A.

The second upper arm drive assembly may comprise any suitable structure for driving the second upper arm 142. The second upper arm drive assembly may include, for example, a rotor of the second upper arm drive motor 142M coupled to the second upper arm drive shaft 142S. The second upper arm drive assembly may further include a second upper arm driving member 142A, a second upper arm driven member 142B, and a second upper arm transmission element 142T. The second upper arm driving member 142A may be coupled to the second upper arm drive shaft 142S, whereas the second upper arm driven member 142B may be a pilot extending from a body of the second upper arm 142. For example, in the depicted embodiment, the second upper arm driving member 142A may be a pulley coupled to or integral with the second upper arm drive shaft 142S. The second upper arm transmission element 142T is connected between the second upper arm driving member 142A and the second upper arm driven member 142B. The second upper arm transmission element 142T may be one or more belts or straps, such as two oppositely-wound conventional metal straps wherein each strap is rigidly coupled (e.g., pinned) to the members 142A, 142B at its end.

Mounted and rotationally coupled at a position spaced from the fifth rotational axis 144 (e.g., at an outboard end of the second upper arm 142), is a second forearm 148. The second forearm 148 is adapted to be rotated in an X-Y plane relative to the second upper arm 142 about a sixth rotational axis 134 located at the spaced position. The second forearm 148 is rotatable in the X-Y plane relative to the second upper arm 142 by a second upper arm drive assembly.

In particular, the second forearm 142 is adapted to be rotated in either a clockwise or counterclockwise rotational direction about the fifth rotational axis 144. Rotation may be +/−about 140 degrees. The rotation of the second forearm 148 about the sixth rotational axis 150 may be provided by an action of a second forearm drive assembly. The second forearm drive assembly includes a second forearm driving member 148A and a second forearm driven member 148B connected by a second forearm transmission element 148T. The second forearm driving member 148A may be a pulley rigidly coupled to the second boom 119, such as at its lower end by a shaft. Other types of rigid connections may be used. The second forearm driven member 148B may be a pilot extending from a body of the second forearm 148, such as at a lower end thereof. The second forearm transmission element 148T may be one or more belts. In some embodiments, the one or more belts may be first and second steel belts oppositely wrapped about the second forearm driving member 148A and the second forearm driven member 148B wherein each belt is discontinuous and pinned at its respective ends to each of the members 148A, 148B.

Located at a position spaced (e.g., offset) from the sixth rotational axis 150 (e.g., on an outboard end of the second forearm 148) is a second wrist member 152. The second wrist member 152 is adapted for translation in the X-Y plane relative to the base 116 and is coupled to a second end effector 154. The second end effector 154 may be identical to the first end effector 138 described in FIGS. 1F and 1G. The second wrist member 152 is adapted for relative rotation about a seventh rotational axis 156 relative to the second forearm 148. The second wrist member 152 may couple to the first end effector 138 at a point outboard from the seventh rotational axis 156 wherein the second end effector 154 is adapted to carry and transport a substrate 105A (shown dotted) during pick and/or place operations.

A further description of a suitable construction for the first and second end effectors 138, 154 may be found in PCT Publication WO 2010/081003 entitled "Systems, Apparatus, and Methods For Moving Substrates." However, the first and second end effector 138, 154 may be of any suitable construction. The first and second end effectors 138, 154 may be passive or may include any suitable active means for holding the substrates 105A, 105B such as a mechanical clamping mechanism or electrostatic holding capability. The first and second end effectors 138, 154 may be coupled to the first and second wrist members 136, 152, respectively, by any suitable means such as mechanical fastening, adhering, clamping, etc. Optionally, the respective wrist members 136, 152 and end effectors 138, 154 may be coupled to each other by being formed as one integral piece.

Rotation of second wrist member 152, and thus the second end effector 154, is imparted by a second wrist member drive assembly. The second wrist member 152 is adapted for rotation relative to the second forearm 148 in either a clockwise or counterclockwise rotational direction about the seventh rotational axis 156 by the second wrist member drive assembly. Rotation may be +/−about 140 degrees. In particular, relative rotation between the second forearm 148 and the second wrist member 152 causes the second wrist member 152 and coupled second end effector 154 to translate in the Y direction into the process chamber 106A as shown in FIG. 1C.

In the depicted embodiment, the second wrist member drive assembly includes, as best shown in FIG. 1B, a second wrist member driving member 152A and a second wrist member driven member 152B connected by a second wrist member transmission element 152T. The second wrist member driving member 152A may be a pulley rigidly coupled to the second upper arm 142, such as at its lower end by a shaft. Other types of rigid connections may be used. The second wrist member driven member 152B may be a pulley coupled to a pilot extending from a body of the second wrist member 152. The second wrist member transmission element 152T may be one or more belts. In some embodiments, the one or more belts may be first and second steel belts, as described above, oppositely wrapped about the second wrist member driving member 152A and the second wrist member driven member 152 B.

As can be seen in FIG. 1B, the second boom 119, may include a rather substantial height spacer member 119A enabling the first boom 118, first upper arm 128, and the first forearm 132 to retract below the second upper arm 142. However, in some embodiments, the ends of the first and second upper arms 128, 142 may be shorter than the booms 118, 119 and may be aligned at the same vertical level.

In operation, in order to move the second end effector 154 to a desired destination for a pick of a substrate 105A, the second upper arm 142 and second forearm 124 may be actuated a sufficient amount, thereby translating the second wrist member 154, to pick or place a substrate 105A from a chamber 106A. At may be at the same time the first wrist member 136 is translated into the process chamber 106B. As the first and second wrist members 136, 152 are simultaneously inserted into the process chambers 106A, 106B to place the substrates 105A, 105B at the desired destination location, moving lift pins or a moving pedestal raise to contact the substrates 105A, 105B and lift the substrates off from the end effectors 138, 154 so that the end effectors 138, 154 may be retracted. The first and second booms 118, 119 of the robot apparatus 104 may then be rotated (e.g. in unison) to the location of another set of process chambers (e.g., process chambers 106E, 106F) to pick up substrates (e.g., having a process completed thereon) and transfer them to the load lock chambers 108, for example.

In the depicted embodiment of FIG. 1A-1C, the robot apparatus 104 is shown located and housed in a transfer chamber 102. However, it should be recognized that this embodiment of robot apparatus 104, may advantageously be used in other areas of electronic device manufacturing, such as in a factory interface 110 wherein the robot apparatus 104 may transport substrates 105 between load ports and load lock chambers 108 of a processing system, for example. The robot apparatus 104 described herein is also capable of other transporting uses.

Figure 1D:
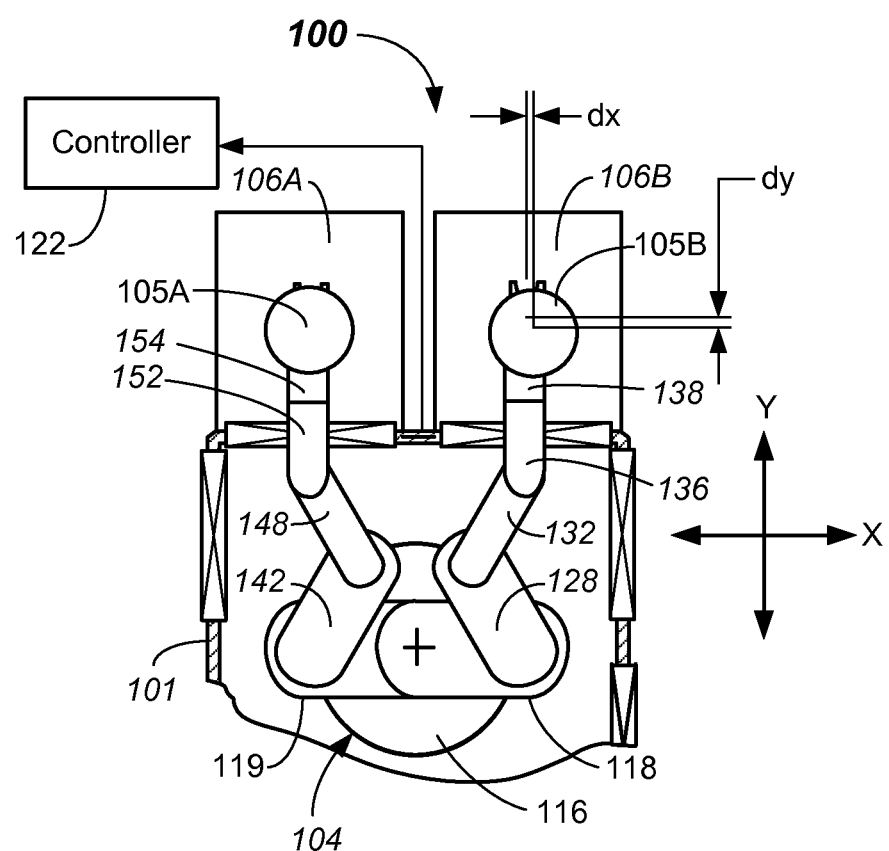
FIG. 1D illustrates a schematic partial top view of an electronic device processing system including a robot apparatus having end effectors supporting substrates inserted into twin chambers wherein one of the substrates is misaligned in the chamber according to embodiments.
Figure 1E:
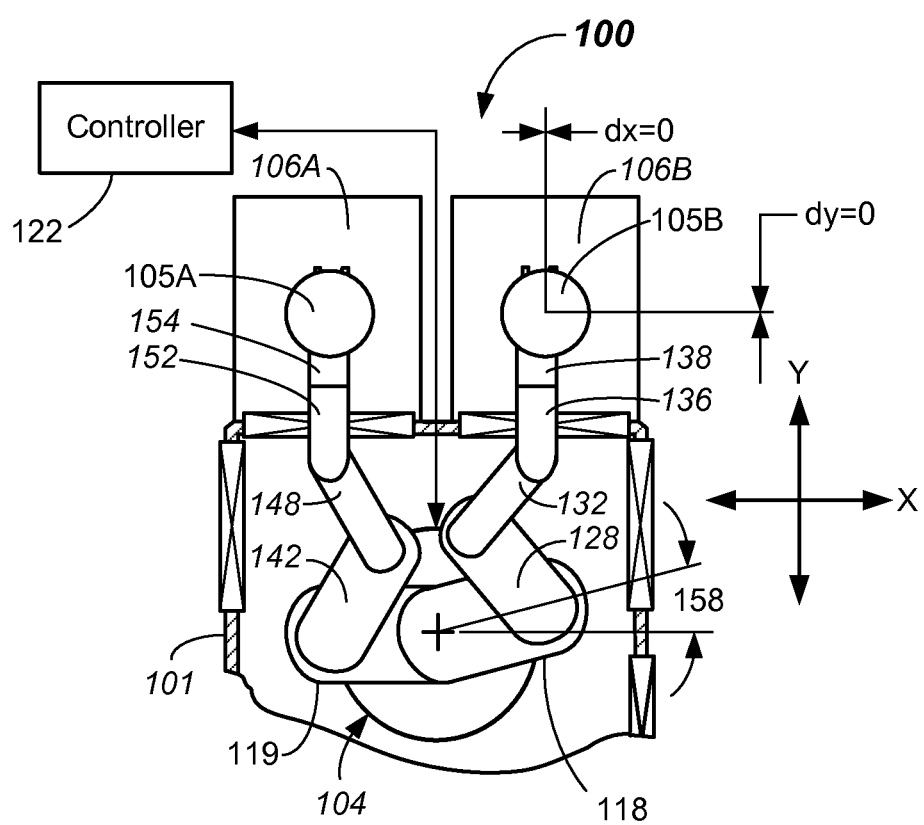
FIG. 1E illustrates a schematic partial top view of an electronic device processing system including a robot apparatus having end effectors supporting substrates inserted into twin chambers wherein the substrate misalignment within the chamber is corrected according to embodiments.
Figure 1F:
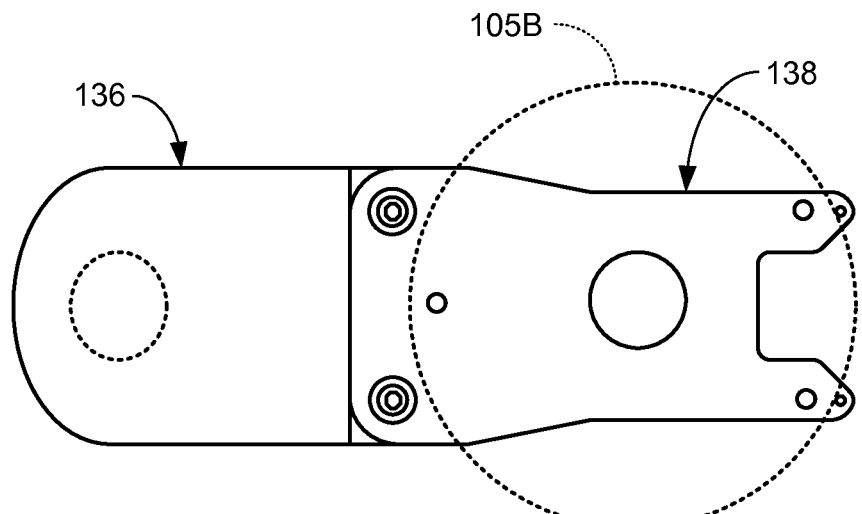
FIGS. 1F and 1G illustrate top and side views, respectively, of a first wrist member having a coupled end effector supporting a substrate according to embodiments.
Figure 1G:
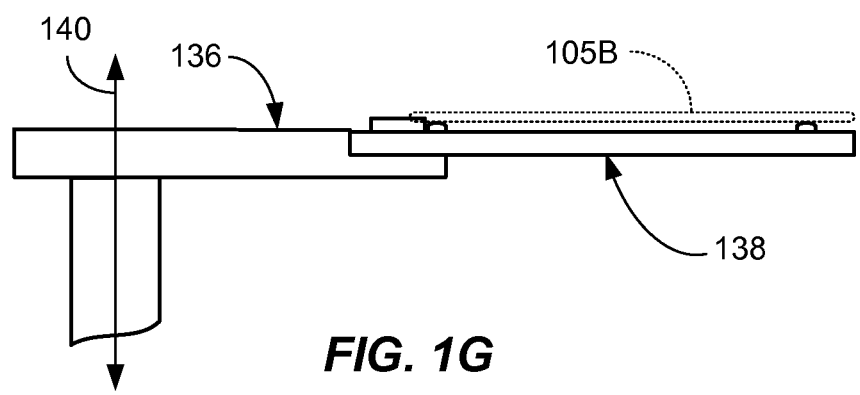

FIGS. 1D-1E illustrate misalignment correction capabilities of one or more embodiments of the robotic apparatus 104 within the processing system 100. As will be apparent following the descriptions, the first and second booms 118, 119 may be rotates to align substrates 105A, 105B with twin chambers 106A, 106B (see FIG. 1A). The first and second upper arm drive assemblies may then be actuated to translate the substrates 105A, 105B into the twin chambers 106A, 106B as is shown in FIG. 1D.

In the described embodiment, the substrate 105B is shown misplaced on the first end effector 138. A degree or extent of misalignment within the process chamber 106B may be determined based upon any suitable substrate position determining technology, such as is described in U.S. Pat. No. 7,933,002 to Serebryanov et al. entitled "Method And Apparatus For Verifying Proper Substrate Positioning." Positional misalignment in the X direction (dx) may be determined, and/or positional misalignment in the Y direction (dy) may be determined (See FIG. 1D). Once determined, the positional misalignment in the X direction (dx) and/or in the Y direction (dy) may be corrected. The substrate 105B is shown misaligned by an amount (dx) and (dy) in both the X and Y directions. The robot apparatus 104 may correct for either one of (dx) or (dy), or both.

FIG. 1E illustrates the misalignment (dx) and (dy) in both the X and Y directions being corrected by the robot apparatus 104. In particular, once the amount of (dx) and (dy) are known, the first boom 118 may be rotated by an angle of 158 using the first boom drive motor 118M to correct (dx). The misalignment (dy) may be corrected by rotating the first upper arm 128 and thus translating the first end effector 138 using the upper arm drive motor 128M. Misalignments (dx) and (dy) may be corrected in any order or simultaneously within chamber 106B. Once the proper alignment within the chamber 106B is achieved, lift pins (not shown) or other suitable lifting apparatus may lift the substrate 105B from the end effector 108. Similarly, any misalignments (dx) and (dy) experienced by the substrate 105A within chamber 106A may be corrected by suitable rotations of the second boom 119 and/or the second upper arm 142. Any misalignments (dx) and (dy) experienced by the substrates 105A, 105B within the chambers 106A, 106B may be corrected simultaneously. Once the misalignment is corrected and the substrates are lifted, the end effectors 138, 154 may be retracted from the chambers 106A, 106B. The booms 118, 119 may then be rotated to another position within the chamber 102. The booms 118, 119 may be moved in unison.

As should be apparent, because each of the drive motors 118M, 119M, 128M, and 142M in the depicted embodiment are consolidated within the motor housing 123, they may be electrically coupled directly through a single sealed electrical connection 160 passing through the motor housing 123. Accordingly, conventional slip ring assemblies for feeding power into motors are not required. Furthermore, because the shafts 118S, 119S, 128S, and 142S are co-axial and the motors are collocated in the motor housing, the coupled wiring need not pass into the various upper arm, forearm, etc.

Accordingly, a simple construction is provided. Furthermore, the use of a hermetic seal (e.g., a ferrofluid seal) may be avoided as all the drive motors 118M, 119M, 128M, and 142M are provided at vacuum.

The drive shafts 118S, 119S, 128S, and 142S, first and second booms 118, 119, and first and second upper arms 128, 142, first and second forearms 132, 148, and first and second wrist members 136, 152 may be supported for rotation by suitable rotation-accommodating bearings. Any suitable bearing may be used, such as ball bearings. For example, sealed ball bearings may be used.

Figure 2:
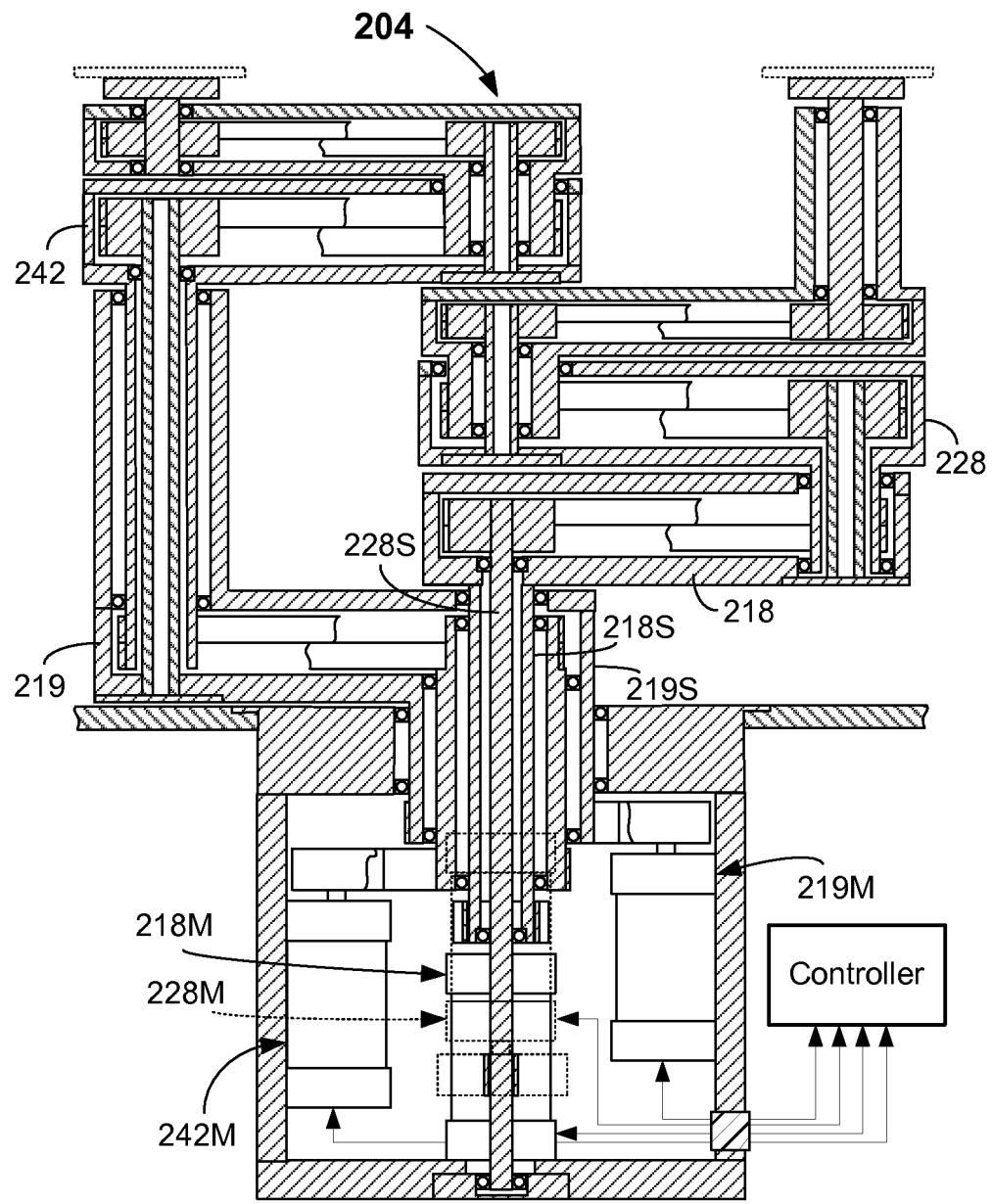
FIG. 2 illustrates a cross-sectional side view of a robot apparatus including offset drive motors according to embodiments, shown in a folded orientation.

FIG. 2 illustrates and alternative embodiment of the robot apparatus 204. All the components are the same as in the previously described embodiment except that the drive motor assembly comprises drive motors that are arranged about the various drive shafts and not co-axial therewith. For example, the first boom 218 is driven by a drive motor 218M that is arranged in back of the first boom drive shaft 218S. The second boom 219 may be driven by a drive motor 219M that may be arranged to the right (as shown) of the first boom drive shaft 219S. The first upper arm 228 may be driven by a drive motor 228M that may be arranged in front of (shown dotted) of the first upper arm drive shaft 228S. The second upper arm 242 may be driven by a drive motor 242M that may be arranged to the left of (as shown) of the second upper arm drive shaft 228S. Other motor arrangements may be used. For example, two motors may be arranged on each side or two in front, two on the side, or the like. The drive motors 218M, 219M, 228M, 242M may be of any suitable type, and may include internal positional feedback capability. For example, the drive motors 218M, 219M, 228M, 242M may be a conventional variable reluctance or permanent magnet electric motor. Other types of motors may be used.

Figure 3:
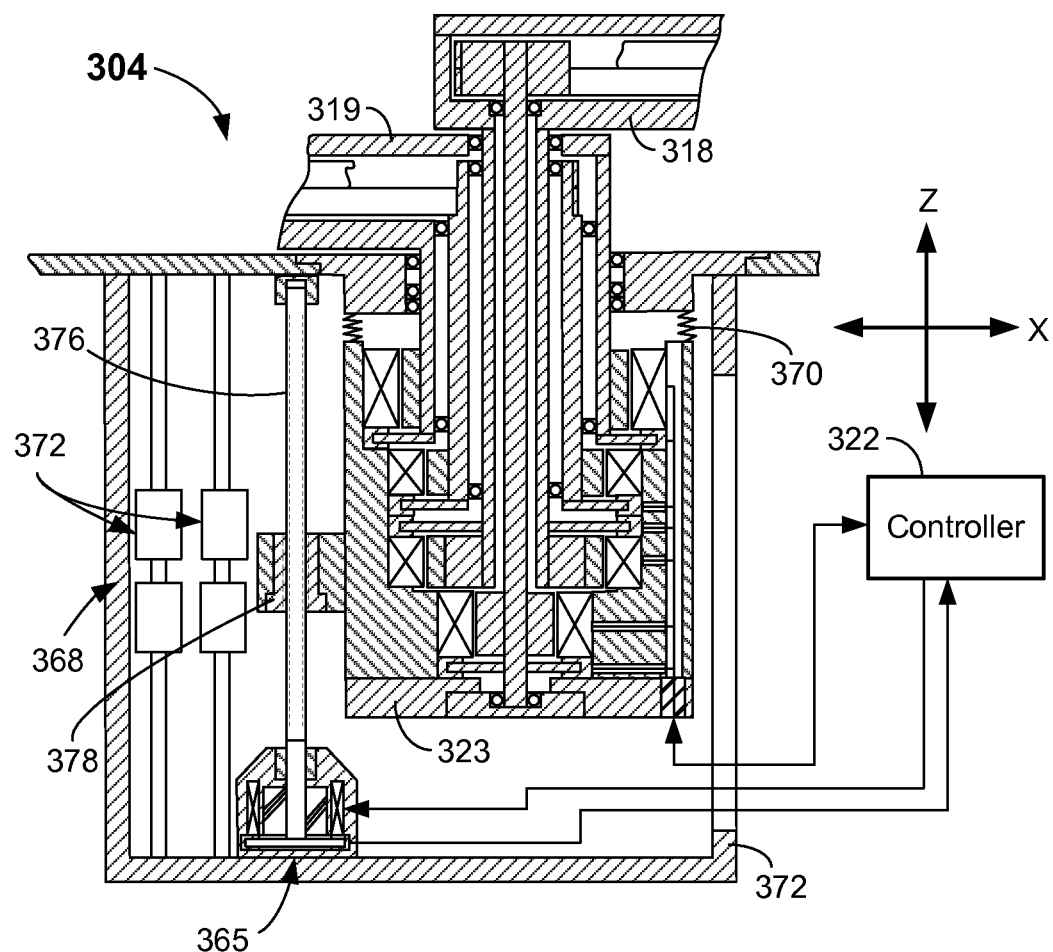
FIG. 3 illustrates a cross-sectional partial side view of a robot apparatus including vertical z-axis capability according to embodiments.

FIG. 3 illustrates a robot apparatus 304 may further include a vertical motor 365 and a vertical drive mechanism 368 that is configured and adapted to cause vertical motion (along the Z axis) of the first and second booms 318, 319, and coupled first and second upper arms (not shown), first and second forearms (not shown), first and second wrist members (not shown), and first and second end effectors (not shown). The first and second booms 318, 319, first and second upper arms, first and second forearms, first and second wrist members, and first and second end effectors may be the same as provided in the FIG. 1B embodiment. The vertical drive mechanism 368 may include a worm drive, lead screw, ball screw, or rack and pinion mechanism that when rotated by the vertical motor 365 causes the motor housing 323 to translate vertically along the Z direction. A bellows 370 or other suitable vacuum barrier may be used to accommodate the vertical motion and also act as a vacuum barrier between the chamber and the inside of the outer motor housing 372 that may be at atmospheric pressure. One or more translation-accommodating devices 374, such as linear bearings, bushings, or other linear motion restraining means may be used to restrain the motion of the motor housing 323 to vertical motion only along the Z direction. In the depicted embodiment, a lead screw 376 may engage a lead nut 378 mounted to the motor housing 323. Vertical motor 365 may include a rotational feedback to provide vertical position feedback information to the controller 322. The same type of Z axis capability may be added to the embodiment of FIG. 2.

Figure 4:
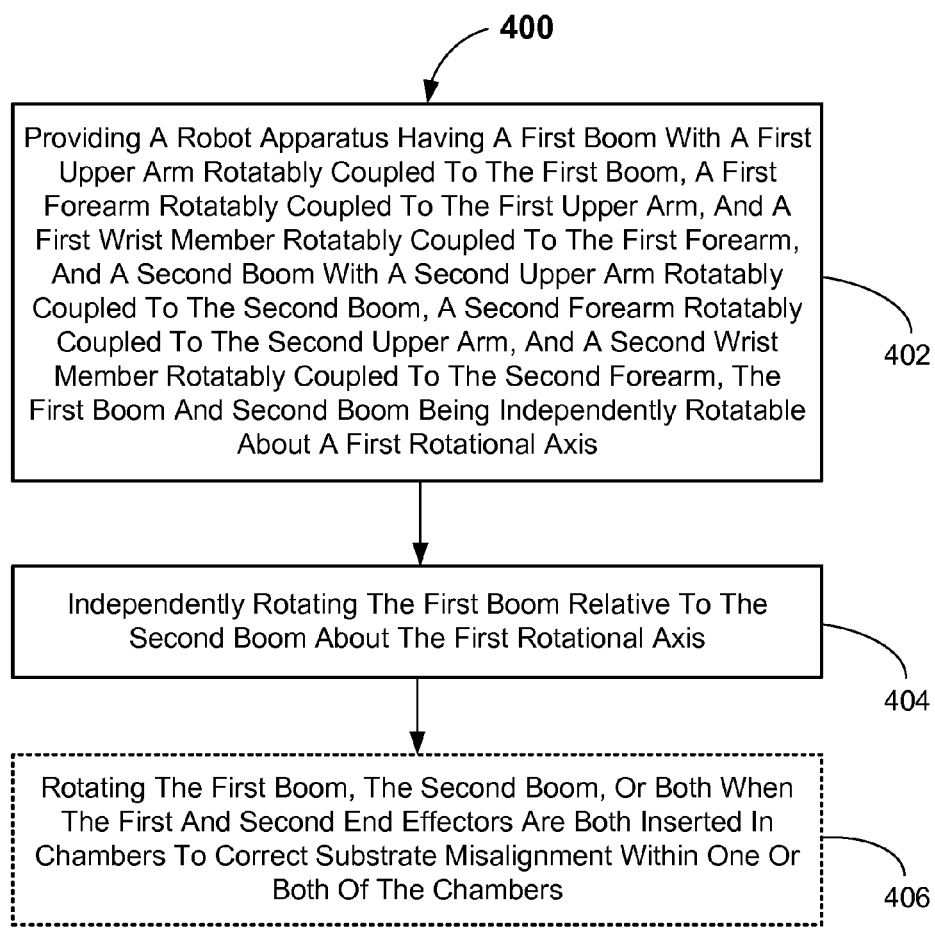
FIG. 4 illustrates a flowchart depicting a method of transporting substrates within an electronic device processing system according to embodiments.

A method 400 of transporting substrates within an electronic device processing system according to embodiments is provided and described with reference to FIG. 4. The method 400 includes providing a robot apparatus having a first boom with a first upper arm rotatably coupled to the first boom, a first forearm rotatably coupled to the first upper arm, and a first wrist member rotatably coupled to the first forearm, and a second boom with a second upper arm rotatably coupled to the second boom, a second forearm rotatably coupled to the second upper arm, and a second wrist member rotatably coupled to the second forearm, the first boom and second boom being rotatable about a first rotational axis in 402, and independently rotating the first boom relative to the second boom about the first rotational axis in 404.

In 406, the first boom (e.g., first boom 118), the second boom (e.g., second boom 118), or both may be rotated when the first end effector (e.g., first end effector 138), and the second end effector (e.g., second end effector 154), are both inserted into twin chambers (e.g., chambers 106A, 106B), to correct substrate misalignment within one or both of the twin chambers.

As should be apparent, using the robot apparatus as described herein, pick and place of a substrates may be accomplished to and from twin chambers, and the overall size of the robot apparatus, and thus the chamber housing the robot apparatus may be reduced because the robot arms may be made shorter. In some embodiments, the method is carried out by simultaneously rotating the first and second upper arms (e.g., first and second upper arms 128, 142) to simultaneously carry out pick or place operations of substrates from or to twin (e.g., side-by-side) chambers.

The foregoing description discloses only example embodiments of the invention. Modifications of the above-disclosed systems, apparatus, and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the following claims.

The invention claimed is:

1. A robot apparatus, comprising:
   a first boom adapted to rotate about a first rotational axis;
   a first upper arm coupled to the first boom at a position offset from the first rotational axis, the first upper arm independently rotatable about a second rotational axis relative to the first boom;
   a first forearm coupled to and adapted for rotation relative to the first upper arm about a third rotational axis at a position offset from the second rotational axis;
   a first forearm drive assembly having a first forearm driving member rigidly coupled to the first boom;
   a first wrist member coupled to and adapted for rotation relative to the first forearm about a fourth rotational axis at a position offset from the third rotational axis, the first wrist member adapted to couple to a first end effector; and
   a second boom positioned above the first boom and adapted to rotate about the first rotational axis independent of the first boom;
   a second upper arm coupled to the second boom at a position offset from the first rotational axis, the second upper arm independently rotatable about a fifth rotational axis relative to the second boom;
   a second forearm coupled to and adapted for rotation relative to the second upper arm about a sixth rotational axis at a position offset from the fifth rotational axis;
   a second forearm drive assembly having a second forearm driving member rigidly coupled to the second boom; and
   a second wrist member coupled to and adapted for rotation relative to the second forearm about an seventh rotational axis at a position offset from the sixth rotational axis, the second wrist member adapted to couple to a second end effector,
   wherein the first end effector and the second end effector are offset horizontally from each other in a horizontal direction and configured and adapted to be inserted into and service adjacent, side-by-side twin chambers by being extendable in generally parallel longitudinal directions orthogonal to the horizontal direction.

2. The robot apparatus of claim 1, comprising:
   a drive assembly including
      a first boom drive assembly having a first boom drive shaft adapted to cause independent rotation of the first boom relative to the second boom; and
      a second boom drive assembly having a second boom drive shaft adapted to cause independent rotation of the second boom relative to the first boom.

3. The robot apparatus of claim 1, comprising:
   a drive assembly including
   a first upper arm drive assembly including a first upper arm drive motor and a first upper arm drive shaft, a rotor of the first upper arm drive motor coupled to the first upper arm drive shaft, and a stator of the first upper arm drive motor stationarily mounted in a motor housing.

4. The robot apparatus of claim 3, wherein the drive assembly further comprises:
   a second upper arm drive assembly including a second upper arm drive motor and a second upper arm drive shaft, a rotor of the second upper arm drive motor coupled to the second upper arm drive shaft, and a stator of the second upper arm drive motor stationarily mounted in a motor housing.

5. The robot apparatus of claim 1, wherein a first boom drive shaft, a second boom drive shaft, a first upper arm drive shaft, and a second upper arm drive shaft are each independently rotatable about the first rotational axis.

6. The robot apparatus of claim 1 wherein the first forearm and first wrist member are adapted to rotate responsive to rotation of the first upper arm.

7. The robot apparatus of claim 1 wherein the second forearm and second wrist member are adapted to rotate responsive to rotation of the second upper arm.

8. The robot apparatus of claim 1, wherein the first forearm drive assembly comprises a first forearm driven member, and a first forearm transmission element connected between the first forearm driving member and the first forearm driven member.

9. The robot apparatus of claim 1, comprising a second forearm drive assembly having a second forearm driving member rigidly coupled to the second boom, a second forearm driven member of the second forearm, and a second forearm transmission element connected between the second forearm driving member and the second forearm driven member.

10. The robot apparatus of claim 1, comprising a first wrist drive assembly having a first wrist driving member rigidly coupled to the first upper arm, a first wrist driven member, and a first wrist member transmission element connected between the first wrist driving member and first wrist driven member.

11. The robot apparatus of claim 1, comprising a second wrist drive assembly having a second wrist driving member rigidly coupled to the second upper arm, a second wrist driven member, and a second wrist member transmission element connected between the second wrist driving member and the second wrist driven member.

12. An electronic device processing system, comprising:
   a transfer chamber;

twin chambers arranged in a side-by-side orientation and coupled to the transfer chamber;

a robot apparatus at least partially contained in the chamber and adapted to transport substrates to and from process chambers, the robot apparatus including a first boom adapted to rotate about a first rotational axis;

a first upper arm coupled to the first boom at a position offset from the first rotational axis, the first upper arm independently rotatable about a second rotational axis relative to the first boom;

a first forearm coupled to and adapted for rotation relative to the first upper arm about a third rotational axis at a position offset from the second rotational axis;

a first forearm drive assembly having a first forearm driving member rigidly coupled to the first boom;

a first wrist member coupled to and adapted for rotation relative to the first forearm about a fourth rotational axis at a position offset from the third rotational axis, the first wrist member adapted to couple to a first end effector; and a second boom positioned above the first boom and adapted to rotate about the first rotational axis independent of the first boom;

a second upper arm coupled to the second boom at a position offset from the first rotational axis, the second upper arm independently rotatable about a fifth rotational axis relative to the second boom;

a second forearm coupled to and adapted for rotation relative to the second upper arm about a sixth rotational axis at a position offset from the fifth rotational axis;

a second forearm drive assembly having a second forearm driving member rigidly coupled to the second boom; and a second wrist member coupled to and adapted for rotation relative to the second forearm about a seventh rotational axis at a position offset from the sixth rotational axis in a horizontal direction, the second wrist member adapted to couple to a second end effector, wherein the first end effector and the second end effectors are offset horizontally from each other and configured and adapted to be inserted into and service adjacent, side-by-side twin chambers by being extendable in generally parallel longitudinal directions orthogonal to the horizontal direction.

13. The system of claim 12, wherein the robot apparatus comprises a drive assembly having:
a first boom drive assembly having a first boom drive shaft adapted to cause independent rotation of the first boom; and
a second boom drive assembly having a second boom drive shaft adapted to cause independent rotation of the second boom.

14. The robot apparatus of claim 12, comprising:
a drive assembly having
a first upper arm drive assembly including a first upper arm drive motor and a first upper arm drive shaft, a rotor of the first upper arm drive motor coupled to the first upper arm drive shaft, and a stator of the first upper arm drive motor stationarily mounted in a motor housing; and
a second upper arm drive assembly including a second upper arm drive motor and a second upper arm drive shaft, a rotor of the second upper arm drive motor coupled to the second upper arm drive shaft, and a stator of the second upper arm drive motor stationarily mounted in the motor housing.

15. The system of claim 12, wherein each of the first boom, the second boom, the first upper arm, the second upper arm, the first forearm, the second forearm, the first wrist member, and the second wrist member are rotatable in an X-Y plane.

16. A method of transporting substrates within an electronic device processing system, comprising:
providing a robot apparatus having a first boom with a first upper arm rotatably coupled to the first boom, a first forearm rotatably coupled to the first upper arm, a first forearm drive assembly having a first forearm driving member rigidly coupled to the first boom, and a first wrist member rotatably coupled to the first forearm, the first wrist member coupled to a first end effector, and a second boom positioned above the first boom with a second upper arm rotatably coupled to the second boom, a second forearm rotatably coupled to the second upper arm, a second forearm drive assembly having a second forearm driving member rigidly coupled to the second boom, and a second wrist member rotatably coupled to the second forearm, the second wrist member coupled to a first end effector, the first boom and second boom being rotatable about a first rotational axis, wherein the first end effector and the second end effector are offset horizontally from each other in a horizontal direction;
servicing adjacent side-by-side twin chambers by extending the first end effector and the second end effector in generally parallel longitudinal directions orthogonal to the horizontal direction;
independently rotating the first boom relative to the second boom about the first rotational axis;
independently rotating the first upper arm about a second rotational axis relative to the first boom; and
independently rotating the second upper arm about a second rotational axis relative to the second boom.

17. The method of transporting substrates of claim 16, comprising:
transporting substrates on a first end effector and second end effector coupled to the first wrist member and second wrist member, respectively.

18. The method of claim 17, comprising:
rotating the first boom, the second boom, or both when the first end effector and the second end effector are both inserted into twin chambers to correct substrate misalignment within one or both of the twin chambers.

19. The method of claim 17, comprising:
simultaneously rotating the first upper arm and the second upper arm to simultaneously enter the first end effector and the second end effector into twin process chambers wherein the twin process chambers are arranged in a side-by-side orientation.

20. The method of claim 17, comprising:
rotating the first boom, the second boom, the first upper arm, and the second upper arm, by rotating a first boom drive shaft, a second boom drive shaft, a first upper arm drive shaft, and a second upper arm drive shaft all arranged in a co-axial orientation.

* * * * *